United States Patent
Sasai

(10) Patent No.: US 6,374,189 B1
(45) Date of Patent: Apr. 16, 2002

(54) FREQUENCY ANALYZING DEVICE

(75) Inventor: Toshihiro Sasai, Kyoto (JP)

(73) Assignee: NuCore Technology Inc., Sunnyvale, CA (US)

( * ) Notice: Subject to any disclaimer, the term of this patent is extended or adjusted under 35 U.S.C. 154(b) by 0 days.

(21) Appl. No.: 09/334,482

(22) Filed: Jun. 16, 1999

(30) Foreign Application Priority Data

Jun. 19, 1998 (JP) .......................................... 10-172619

(51) Int. Cl.$^7$ .............................................. G01R 23/00
(52) U.S. Cl. ............................ 702/75; 702/66; 702/57; 702/76; 324/76.19
(58) Field of Search .............................. 702/75, 76, 66, 702/57, 189, 194, 77; 704/203, 225, 207, 208; 324/76.12, 76.19

(56) References Cited

U.S. PATENT DOCUMENTS 3,648,041 A * 3/1972 Beatrice ...................... 708/811
3,697,703 A * 10/1972 Clark, Jr. et al. ........... 704/203

* cited by examiner

Primary Examiner—Marc S. Hoff
Assistant Examiner—Hien Vo
(74) Attorney, Agent, or Firm—Townsend and Townsend and Crew LLP; Kenneth R. Allen

(57) ABSTRACT

A frequency analyzing device for detecting a signal component of a predetermined analytic frequency to be analyzed in an input signal includes a multiplication circuit and an integration circuit. The multiplication circuit controls a switched capacitor circuit for discretely storing an input signal using a predetermined pulse signal whose frequency changes according to an amplitude of an orthogonal function system signal having the analytic frequency, and outputs charges representing a multiplication result of the input signal and the orthogonal function system signal. The integration circuit integrates the charges output from the multiplication circuit and outputs integration values as signal components of the analytic frequency contained in the input signal.

9 Claims, 16 Drawing Sheets

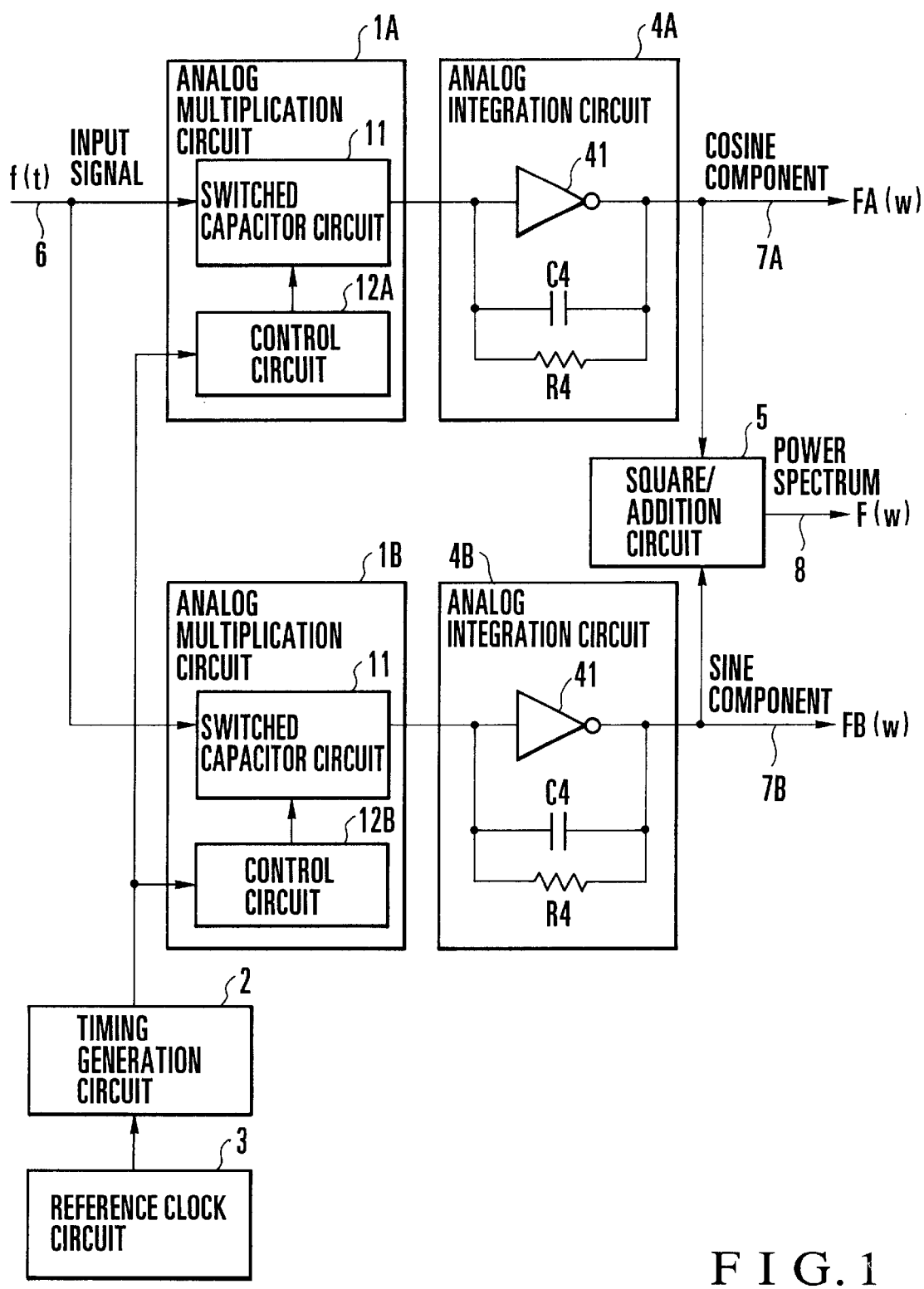
F I G. 1

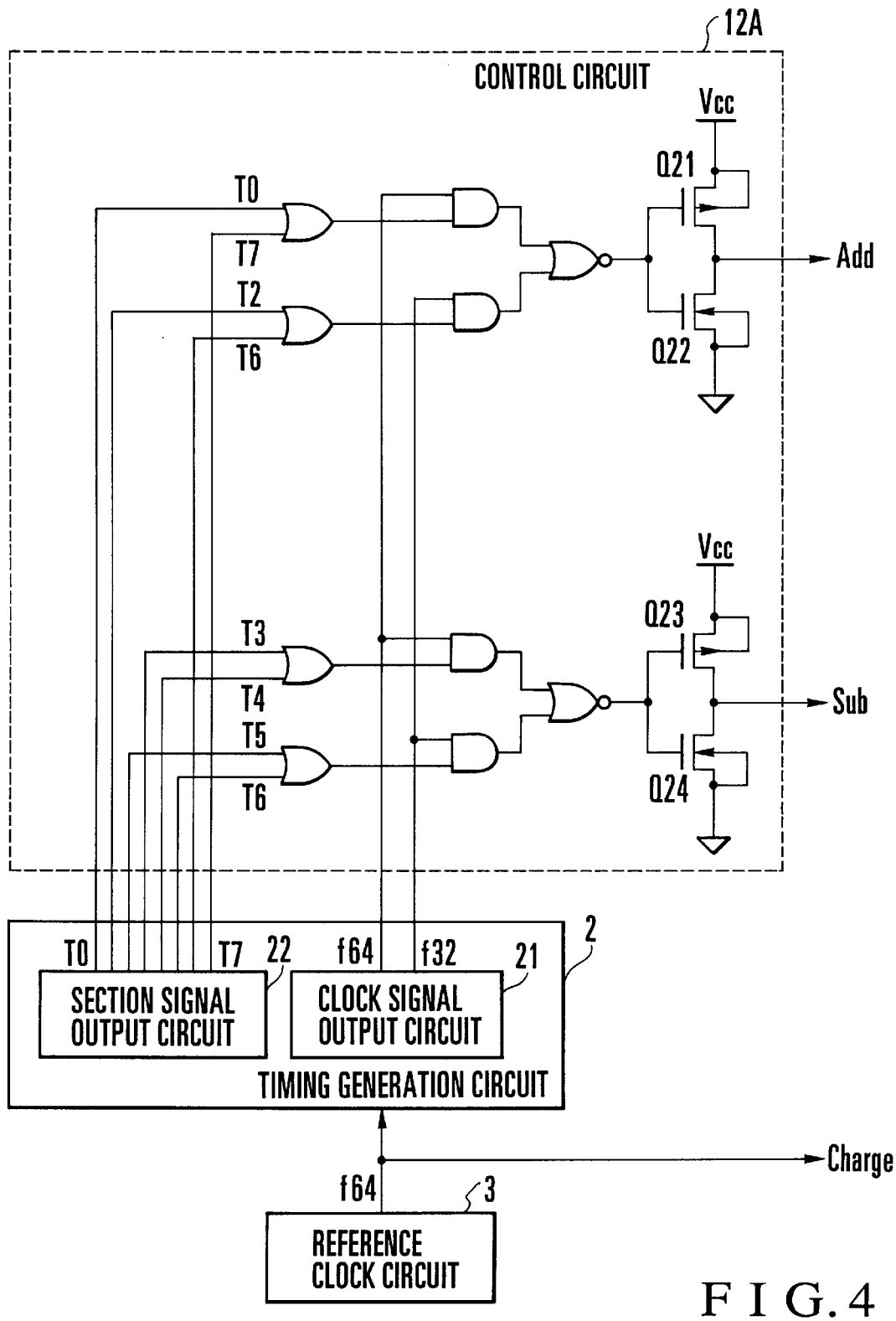
F I G. 4

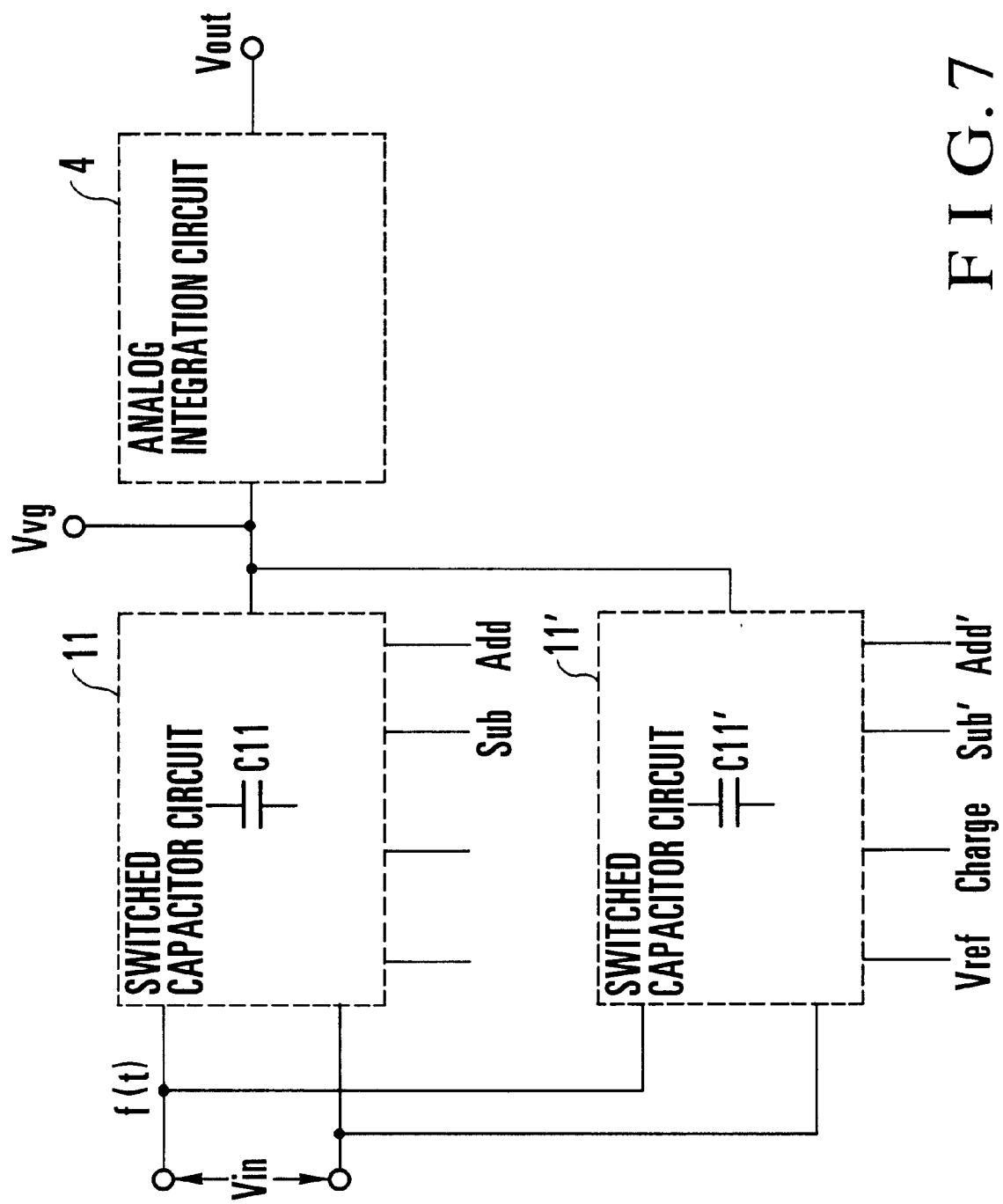
F I G. 7

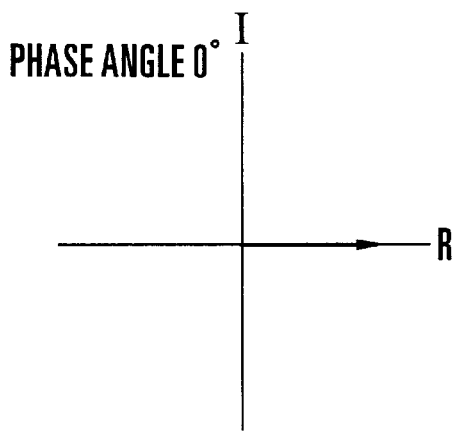
F I G. 10 A
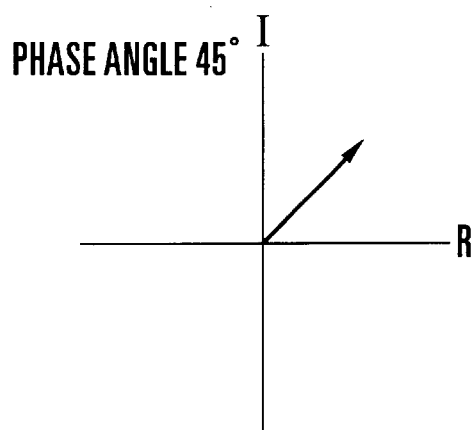
F I G. 10 B
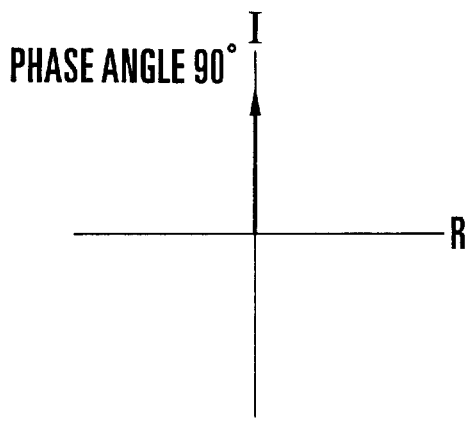
F I G. 10 C
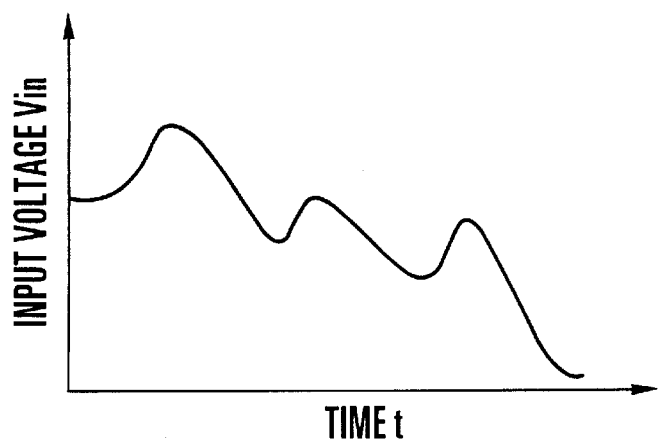
F I G. 11

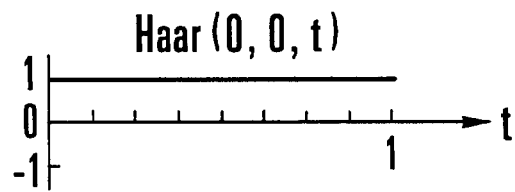
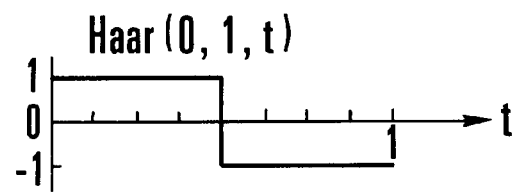
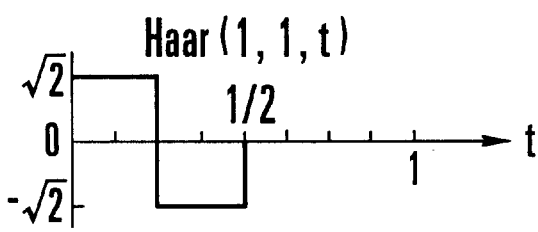
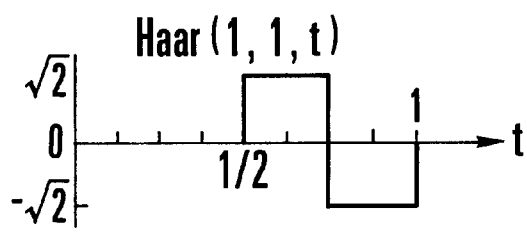
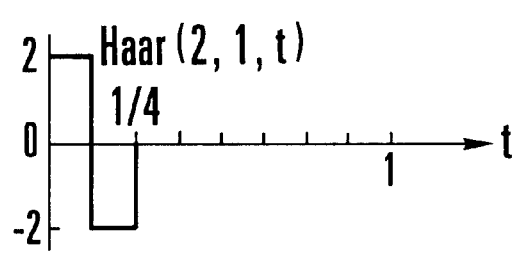
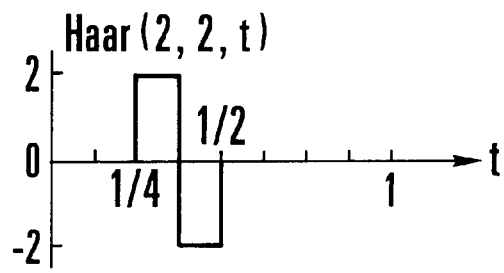
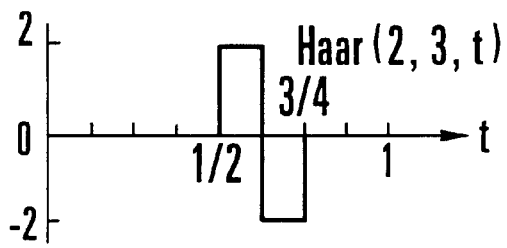
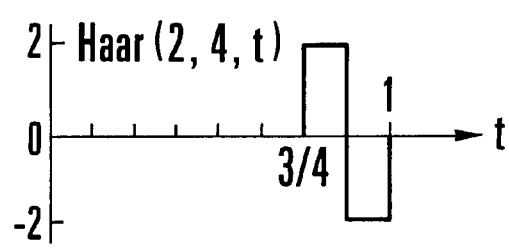
F I G. 18

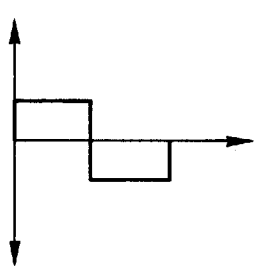 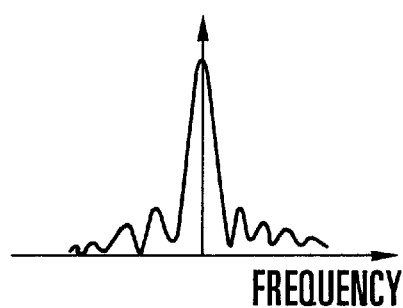 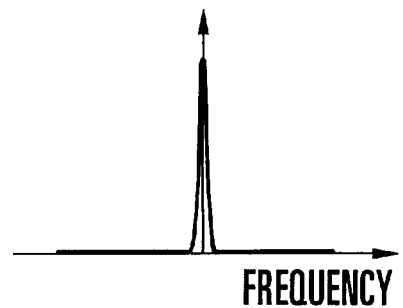
FIG.21A    FIG.21B    FIG.21C
FIG.22A
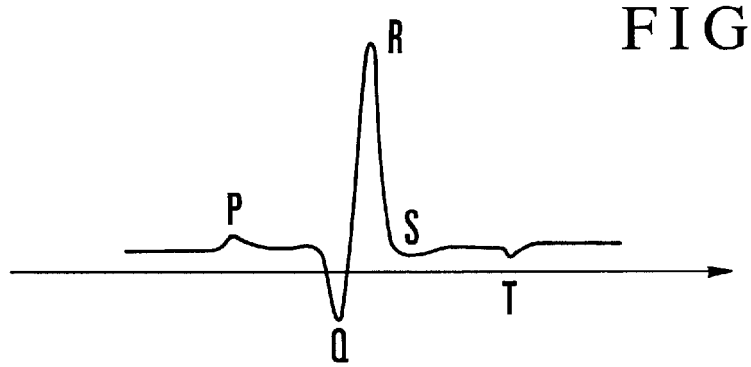
FIG.22B
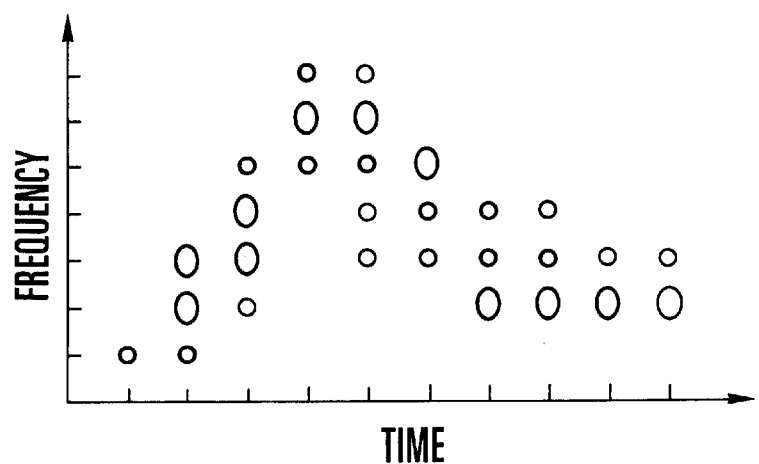
FIG. 23

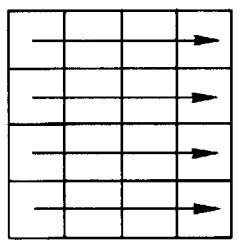
F I G. 24A
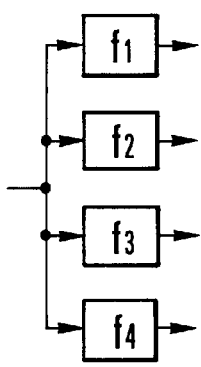
F I G. 24B
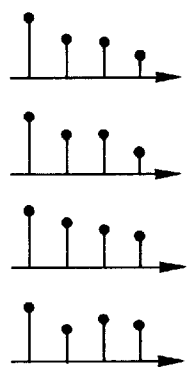
F I G. 24C
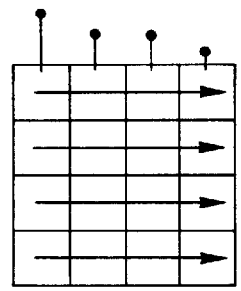
F I G. 24D
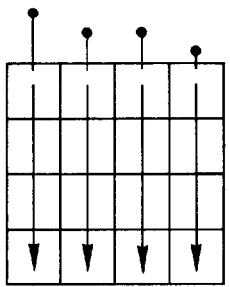
F I G. 24E
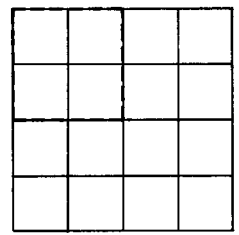
F I G. 24F
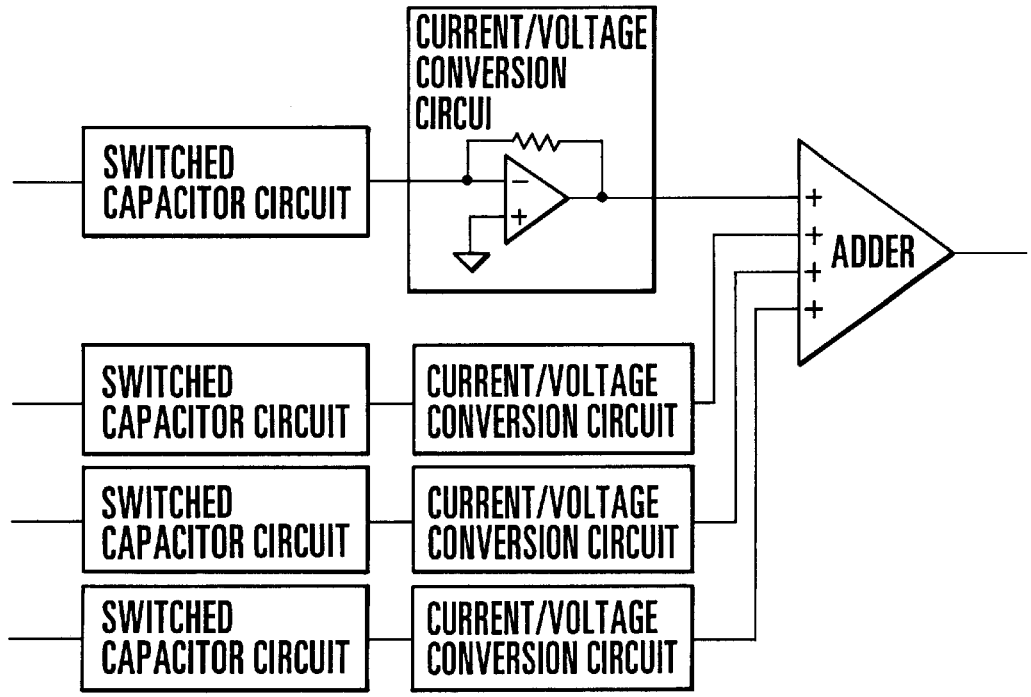
F I G. 25

FREQUENCY ANALYZING DEVICE

BACKGROUND OF THE INVENTION

The present invention relates to a frequency analyzing device and, more particularly, to a frequency analyzing device for analyzing the frequency of an input signal using various orthogonal function system signals.

Generally, when the frequency components of an input signal which continuously changes over time are to be analyzed using various orthogonal function system signals, a frequency analyzing device (or a frequency spectrum measuring device) called a spectrum analyzer is used.

There are two basic measurement processing methods used by frequency analyzing devices of this type.

As one method, all arithmetic processing operations for an input signal are performed as analog processing on the basis of Fourier transform formulas of a continuous wave.

Fourier transform formulas for an input signal f(t) that continuously changes over time are represented by equations (1) to (3):

$$f(t) = \frac{a_0}{2} + \sum_{n=1}^{\infty} (a_n \cos(t) + b_n \sin(t)) \quad (1)$$

$$a_n = \frac{1}{\pi} \int_0^{2\pi} f(t) \cos(nt) dt \quad (2)$$

$$b_n = \frac{1}{\pi} \int_0^{2\pi} f(t) \sin(nt) dt \quad (3)$$

where $a_n$ and $b_n$ are Fourier coefficients and represent a cosine wave component and a sine wave component, respectively. The magnitude, e.g., power spectrum P(n) of a predetermined analysis frequency component contained in the input signal f(t) can be obtained from $a_n$ and $b_n$ on the basis of equation (4):

$$P(n) = \sqrt{(a_n^2 + b_n^2)} \quad (4)$$

When the input signal f(t) that continuously changes over time is multiplied by sine and cosine wave signals having an analytic frequency of interest, and the results are integrated at one period (0 to $2\pi$) of the input signal f(t), as in equations (1) to (3), the cosine and sine wave components of the analytic frequency contained in the input signal f(t) can be obtained.

FIG. 16 shows the arrangement of a conventional frequency analyzing device based on analog processing. The frequency analyzing device comprises a sine wave generator 93, analog multiplier 91, and analog integrator 94.

In this case, a sine wave output 92 generated by the sine wave generator 93 is multiplied by an input signal f(t) 96 input from an external device and continuously changing over time by the analog multiplier 91. The output is integrated at several periods by the analog integrator 94, and a desired frequency component is detected.

As the other method, after an input signal is converted into a digital signal, subsequent processing is performed by calculating numerical values using discrete Fourier transform formulas.

In this method, an input signal is sampled (sampling and digital conversion) by an A/D converter, and subsequent processing is performed by calculating numerical values by discrete Fourier transform processing using a DSP (Digital Signal Processor). With this method, spectra can be calculated from the input signal in units of different analytic frequencies.

However, in such a conventional frequency analyzing device, e.g., the frequency analyzing device based on analog processing, the circuit scale of the sine wave generator 93 and analog integrator 94 becomes large, and the circuit cannot be integrated on a small semiconductor chip.

For example, to generate an analog sine wave, a capacitor or inductor with a relatively large capacitance or inductance is required depending on its frequency.

The analog integrator 94 is realized by an operational amplifier and capacitor. To realize this using a semiconductor integrated circuit, a number of elements are necessary, and the chip area increases. In addition, to realize a capacitor with a large capacity. using a semiconductor integrated circuit, the chip area further increases.

When spectra of a plurality of frequencies are to be simultaneously measured, the above-described frequency analyzing devices equal in number to desired frequencies must be prepared. In this case, the circuit scale further increases.

In this case, in the above-described conventional frequency analyzing device (FIG. 16), one analog multiplier and one analog integrator may be used, and the frequency output 92 from the sine wave generator 93 may be swept to measure a plurality of frequency spectra from the input signal 96.

In this case, however, frequency sweeping takes time, a plurality of frequency components cannot be simultaneously measured, and only a frequency component of the input signal, which has a repetitive waveform, can be measured.

According to the frequency analyzing device based on digital processing, to execute frequency analysis at a high speed equal to that of the frequency analyzing device based on analog processing, a high-speed A/D converter and DSP, and for example, a memory accessible at a high speed and product-sum operation circuit are required. For this reason, the circuit scale becomes large, and power consumption increases.

To speed up numerical calculation, an algorithm called FFT (Fast Fourier Transform) is improved and widely used. When the number of samples of an input signal is N, product-sum operation of complex numbers need be performed 2NlogN times.

Hence, even when a spectrum is to be calculated at a high speed using a digital calculation circuit, the spectrum cannot be obtained immediately after measurement.

SUMMARY OF THE INVENTION

The present invention has been made to solve the above problems, and as its object to provide a frequency analyzing device which can reduce the circuit scale and can be integrated on a small semiconductor chip without decreasing the speed of frequency analysis.

In order to achieve the above object, according to the present invention, there is provided a frequency analyzing device for detecting a signal component of a predetermined analytic frequency to be analyzed in an input signal, comprising a multiplication circuit which controls a switched capacitor circuit for discretely storing an input signal using a predetermined pulse signal whose frequency changes according to an amplitude of an orthogonal function system signal having the analytic frequency, and outputs charges representing a multiplication result of the input signal and the orthogonal function system signal, and an integration circuit for integrating the charges output from the multiplication circuit and outputting integration values as signal components of the analytic frequency contained in the input signal.

BRIEF DESCRIPTION OF THE DRAWINGS

FIG. 1 is a block diagram of a frequency analyzing device according to an embodiment of the present invention;

FIG. 4 is a block diagram showing the arrangement of a control circuit;

FIG. 7 is a block diagram showing another arrangement of an analog multiplication circuit;

FIGS. 10A, 10B, and 10C are explanatory views showing the phase relationships between an input signal and approximate cosine wave signal or approximate sine wave signal;

FIG. 11 is an explanatory view showing an example of an input signal waveform;

FIG. 18 is an explanatory view showing a Haar function system;

FIGS. 21A, 21B, and 21C are explanatory views showing analyzed spectra by different orthogonal function systems;

FIGS. 22A and 22B are explanatory views showing typical electrocardiograph signal waveforms;

FIG. 23 is an explanatory view showing an example of frequency analysis used for speech recognition;

FIGS. 24A to 24F are explanatory views showing image compression methods; and

FIG. 25 is a block diagram showing a reconstruction circuit.

DESCRIPTION OF THE PREFERRED EMBODIMENTS

Figure 2:
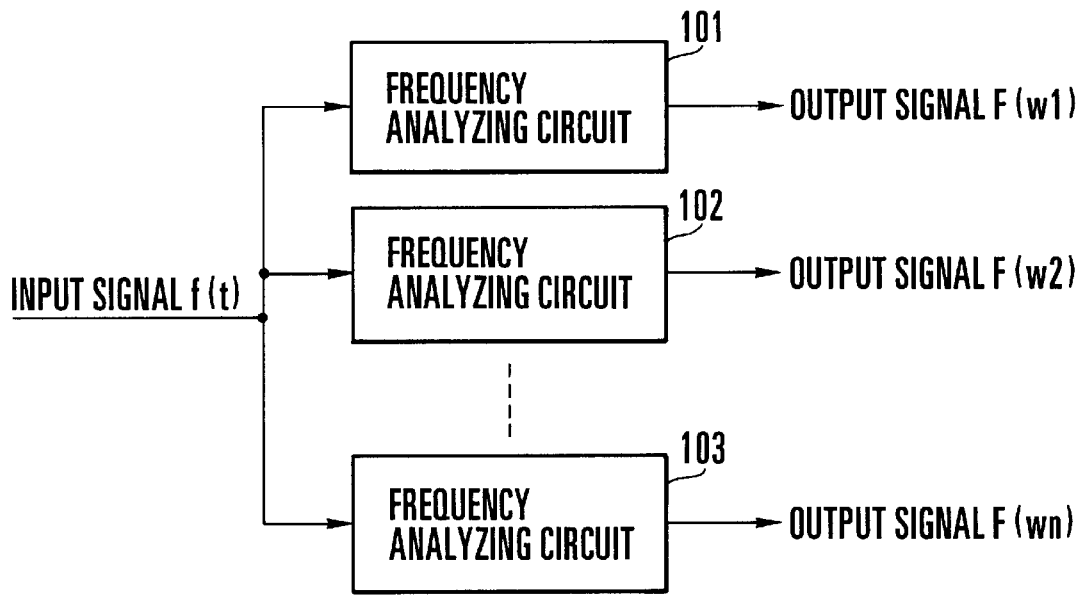
FIG. 2 is a block diagram of a frequency analyzing device according to another embodiment of the present invention.

The present invention will be described next with reference to the accompanying drawings.

FIG. 1 shows a frequency analyzing device according to an embodiment of the present invention. Referring to FIG. 1, an analog multiplication circuit 1A and analog integration circuit 4A (first set) for outputting a cosine wave component FA(w) 7A of a predetermined frequency to be analyzed, i.e., analytic frequency $f_x$ from an input signal f(t) 6 that continuously changes over time, and an analog multiplication circuit 1B and analog integration circuit 4B (second set) for outputting a sine wave component FB(w) 7B of the analytic frequency $f_x$ from the input signal f(t) are parallelly connected to the input signal f(t).

On the output side, a square/addition circuit 5 which receives the cosine wave component FA(w) and sine wave component FB(w) and outputs a power spectrum F(w) 8 of the analytic frequency $f_x$ on the basis of the above-described equation (4) is connected.

The analog multiplication circuits 1A and 1B have switched capacitor circuits 11 which discretely receive and output charges from the input signal f(t) at a predetermined timing on the basis of outputs from the control circuits 12A and 12B, respectively.

Each of the analog integration circuits 4A and 4B has an inverting amplifier 41 having a capacitor (capacitive element) C4 and resistor (resistive element) R4 parallelly connected between the input and output terminals. Charges output from the switched capacitor circuit 11 are stored in the capacitor C4, integrated, and output as the cosine wave component FA(w) or sine wave component FB(w) of the analytic frequency $f_x$.

The switched capacitor circuit 11 can control the amount of charges obtained in a predetermined period by controlling the number of times of reception in the predetermined period. The charge amount is in proportion to the number of times of reception.

In the present invention, the number of times of reception per unit time is controlled on the basis of a pulse signal whose frequency changes depending on the amplitude of the cosine wave signal or sine wave signal of the analytic frequency $f_x$, thereby obtaining a multiplication result of the input signal f(t) and the cosine wave signal or sine wave signal.

In the present invention, one period of the cosine wave signal and sine wave signal is divided into a plurality of sections. A pulse signal is generated on the basis of an approximate cosine wave signal and approximate sine wave signal, which change in staircase shapes by replacing the amplitudes with multivalues in units of sections.

Actually, a timing generation circuit 2 generates a timing signal representing a section and a plurality of clock signals for defining the number of times of reception on the basis of a reference clock corresponding to an integer multiple of the analytic frequency $f_x$ output from a reference clock circuit 3.

The control circuits 12A and 12B receive the timing signal and clock signals, select clock signals corresponding to the amplitude of each section by a logic circuit based on the approximate cosine wave signal and approximate sine wave signal, and output the clock signals to the switched capacitor circuits 11.

With this arrangement, no sine wave generation circuit for generating a sine wave signal, which has a relatively large circuit scale, is required, unlike the prior art, so the frequency analyzing device can be made compact.

As described above, in the present invention, he amplitude of a cosine wave signal (or sine wave signal) of the analytic frequency is approximated with a multivalue, and charges from the input signal are discretely received by the switched capacitor circuit in accordance with the number of times of reception per unit time corresponding to the multivalued amplitude, thereby approximately outputting the multiplication result of the input signal and cosine wave signal. Hence, frequency analysis can be continuously performed at a high speed using a circuit arrangement with a relatively small scale.

A frequency analyzing device for outputting both the cosine wave signal and sine wave signal has been described above. However, one of the cosine wave signal and sine wave signal may be output, as needed.

As shown in FIG. 2, when the above-described frequency analyzing devices are connected parallel to each other for a plurality of analytic frequencies, a plurality of frequencies can be simultaneously analyzed.

Hence, unlike the prior art, the frequency to be analyzed need not be sequentially switched and analyzed every repetitive period of the input signal. Even when the input signal has no periodicity, a plurality of frequencies can be accurately analyzed.

Each circuit portion will be described below in detail with reference to the accompanying drawings.

Figure 3:
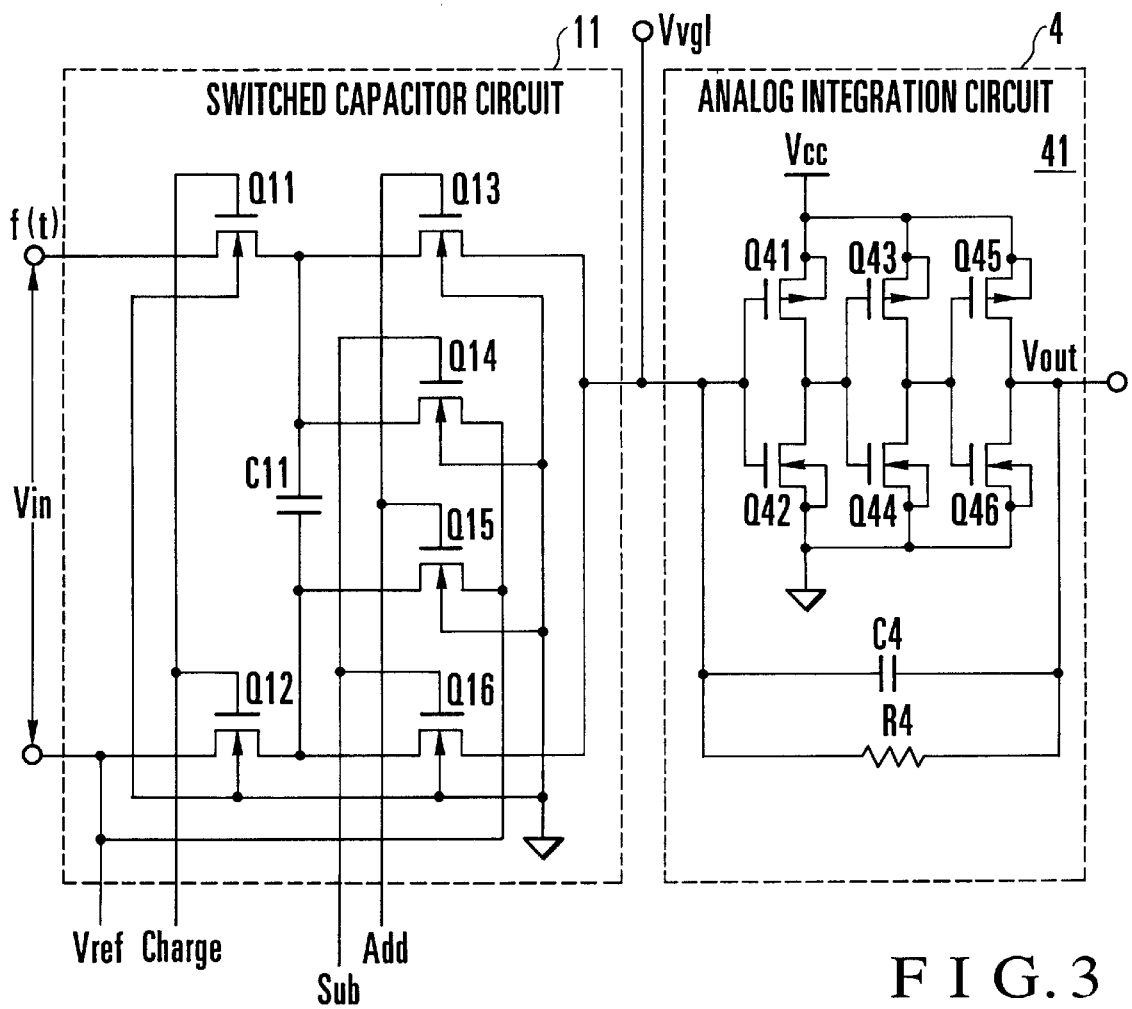
FIG. 3 is a circuit diagram showing the arrangement of a switched capacitor circuit and analog integration circuit.

FIG. 3 shows the arrangements of the switched capacitor circuit and analog multiplication circuit.

In the switched capacitor circuit 11, a capacitor C11 is a capacitive element for receiving charge corresponding to the difference between a voltage $V_{in}$ of the input signal and a reference voltage $V_{ref}$ through switches (CMOSFETs) Q11 and Q12 controlled by a Charge signal.

The charges received by the capacitor C11 are output to the analog integration circuit 4 through switches (CMOSFETs) Q13 and Q15 controlled by an Add signal (pulse signal) or through switches (CMOSFETs) Q14 and Q16 controlled by a Sub signal (pulse signal).

In the analog integration circuit 4, three CMOS inverters formed from switches (CMOSFETs) Q41 to Q46 are connected in series and used as the inverting amplifier 41.

Between the input and output terminals of the inverting amplifier 41, the capacitor (capacitive element) C4 for storing charges received by the capacitor C11 of the switched capacitor circuit 11 and the resistor (resistive element) R4 for removing the charges stored in the capacitor C4 at a predetermined time constant are connected in parallel. The output from the switched capacitor circuit 11 is integrated and output as a voltage $V_{out}$.

In the above-described Fourier transform formulas (equations (1) to (3)), the input signal f(t) is integrated using the repetitive period ($2\pi$). In actual engineering applications as well, a signal having a repetitive period (e.g., $2\pi$) is often continuously input to a frequency analyzing device.

However, the repetitive period of an input signal handled in a physical phenomenon is not always clear. In addition, few signals are observed as a finite signal starting from zero and ending at zero.

When integration represented by equation (1) is continuously repeated for this input signal f(t) for many periods, the output result infinitely becomes large like the amplitude of a vibrator (e.g., pendulum) which has no attenuation and is continuously applied with an external force.

For this reason, for such an input signal, frequency analysis processing is executed for only a section with a sufficient length including the assumed repetitive period, which is extracted from the continuously changing input signal, regardless of analog processing or digital processing.

In the present invention, the input signal f(t) is multiplied by filter characteristics that naturally attenuate over time, thereby obtaining the same effect as that of processing of extracting part of an input signal in digital frequency analysis processing to limit the frequency band, i.e., so-called window processing.

More specifically, as shown in FIG. 3, the resistor R4 is connected parallel to the capacitor C4 of the analog integration circuit 4, and an attenuation force is applied to the vibrator by the resistor R4, thereby limiting the amplitude of the vibrator.

With this arrangement, the frequency of an input signal can be continuously analyzed in real time.

Figure 14:
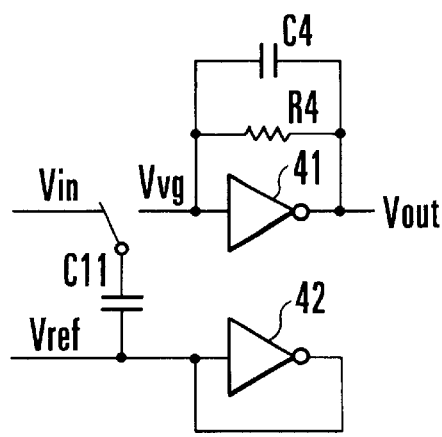
FIGS. 14A and 14B are explanatory views showing addition operation by the switched capacitor circuit.
Figure 14:
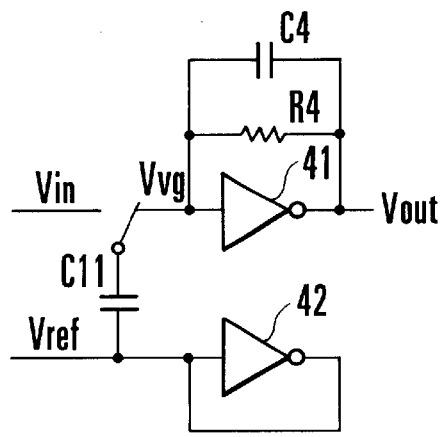

FIGS. 14A and 14B show an addition operation by the switched capacitor circuit.

In this case, as shown in FIG. 14A, first, the capacitor C11 is connected to the input signal side to receive charges Q represented by equation (5).

The reference voltage $V_{ref}$ is an intermediate voltage between a power supply voltage $V_{cc}$ and ground potential GND and is supplied from an inverting amplifier 42.

$$Q = C_{11} \cdot (V_{in} - V_{ref}) \quad (5)$$

Next, as shown in FIG. 14B, the capacitor C11 is connected to the amplifier 41 side.

When an output voltage $V_{vg}$ from the capacitor C11 is different from the reference voltage $V_{ref}$, the voltage $V_{out}$ equals the power supply voltage $V_{cc}$ or ground potential GND, though negative feedback occurs due to the resistor R4.

Hence, the voltage $V_{out}$ changes to make the voltage $V_{vg}$ equal to the reference voltage $V_{ref}$. As a consequence, all the charges Q received by the capacitor C11 move to the capacitor C4.

With this operation, the output voltage $V_{out}$, i.e., integration output changes by $\Delta V_{out}$ given by equation (6):

$$\Delta V_{out} = \frac{Q}{C_4} \quad (6)$$

Figure 15:
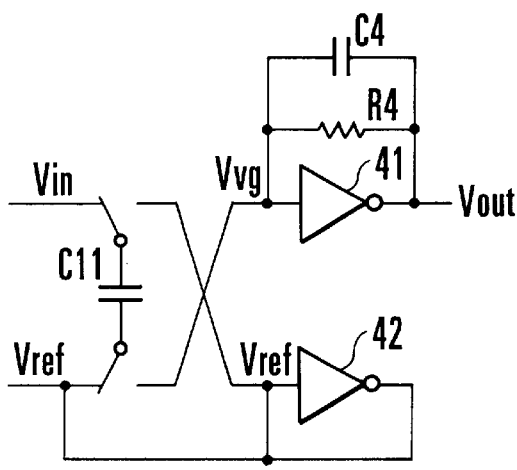
FIGS. 15A and 15B are explanatory views showing subtraction operation by the switched capacitor circuit.
Figure 15:
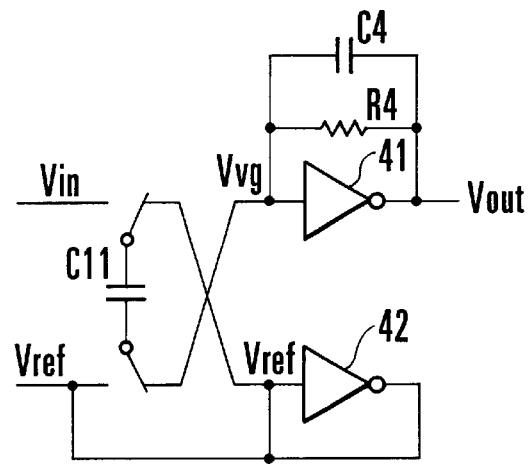
Figure 16:
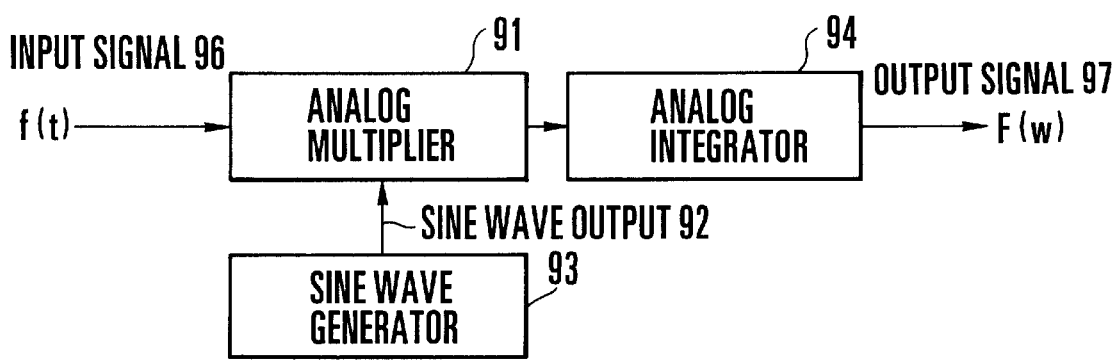
FIG. 16 is a block diagram showing the arrangement of a conventional frequency analyzing device.

FIGS. 15A and 15B show a subtraction operation by the switched capacitor circuit. This operation is almost the same as in FIGS. 14A and 14B.

After the charges Q are stored in the capacitor C11, as shown in FIG. 15A, the capacitor C11 is connected to the amplifier 41 side at an opposite polarity, as shown in FIG. 15B.

Only the charges Q stored in the capacitor C11 move from the capacitor C4, and the output voltage $V_{out}$ changes by an amount represented by equation (7):

$$\Delta V_{out} = -\frac{Q}{C_4} \quad (7)$$

Actually, the addition and subtraction operations are done by controlling switching of the switches Q11 to Q16 shown in FIG. 3.

Especially, in the addition operation, the Add signal of pulse signals is active, and in the subtraction operation, the Sub signal of pulse signals is active.

Since the analog multiplication circuit 1 is constructed by the switched capacitor circuit 11, the circuit can be realized by a MOSFET and can be formed from a circuit with a very small circuit scale.

The inverting amplifier 41 of the analog integration circuit 4 can be formed from a general operational amplifier. However, when the inverting amplifier 41 is constructed by a CMOS inverter formed from a CMOSFET, it can be realized by a small circuit scale.

When an odd number of CMOS inverters are connected in series, a high-gain inverting amplifier can be realized, and the capacitance of the capacitor C4 can be reduced.

Hence, even when the capacitor C4 is formed on a semiconductor substrate, the occupation area can be decreased, and the entire frequency analyzing device can be formed on a semiconductor chip.

The capacitances of the capacitors C11 and C4 are empirically determined on the basis of the ON resistance of the CMOSFET or upper-limit analytic frequency.

The ratio of the capacitor C11 to the capacitor C4 depends on the desired resolving power. However, the attenuation amount due to the resistor R4 need also be taken into consideration.

According to simulations by the present inventors, when a capacitor with a capacitance of 0.1 pF to several pF was used as the capacitor C11, and a capacitor with a capacitance of 1 pF to several ten pF was used as the capacitor C4, a satisfactory analysis result was obtained.

The control circuit will be described next with reference to FIG. 4.

Figure 5A:
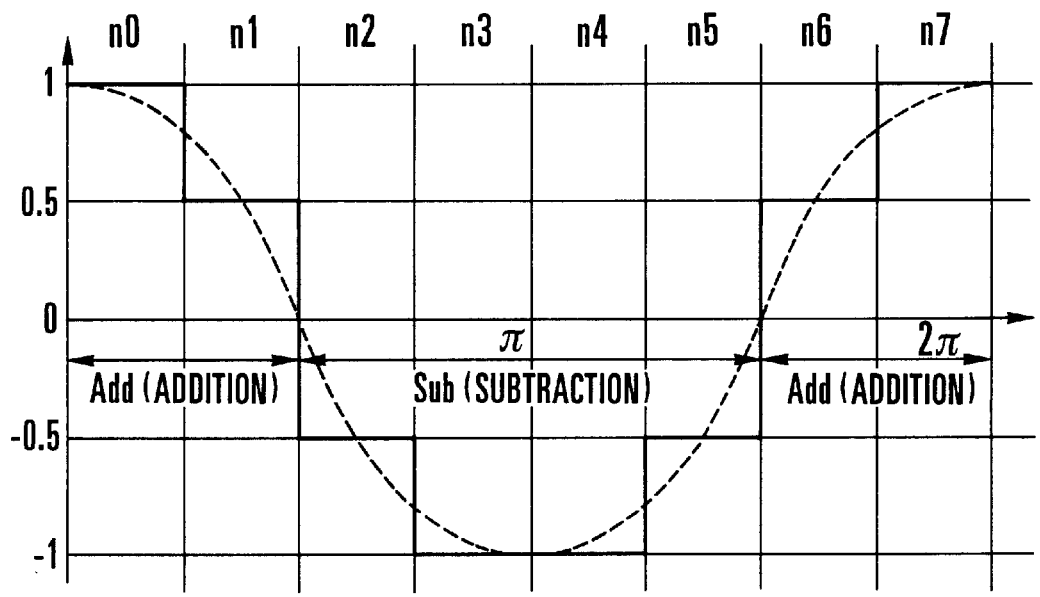
FIGS. 5A and 5B are explanatory views showing an operation of the control circuit.
Figure 5B:
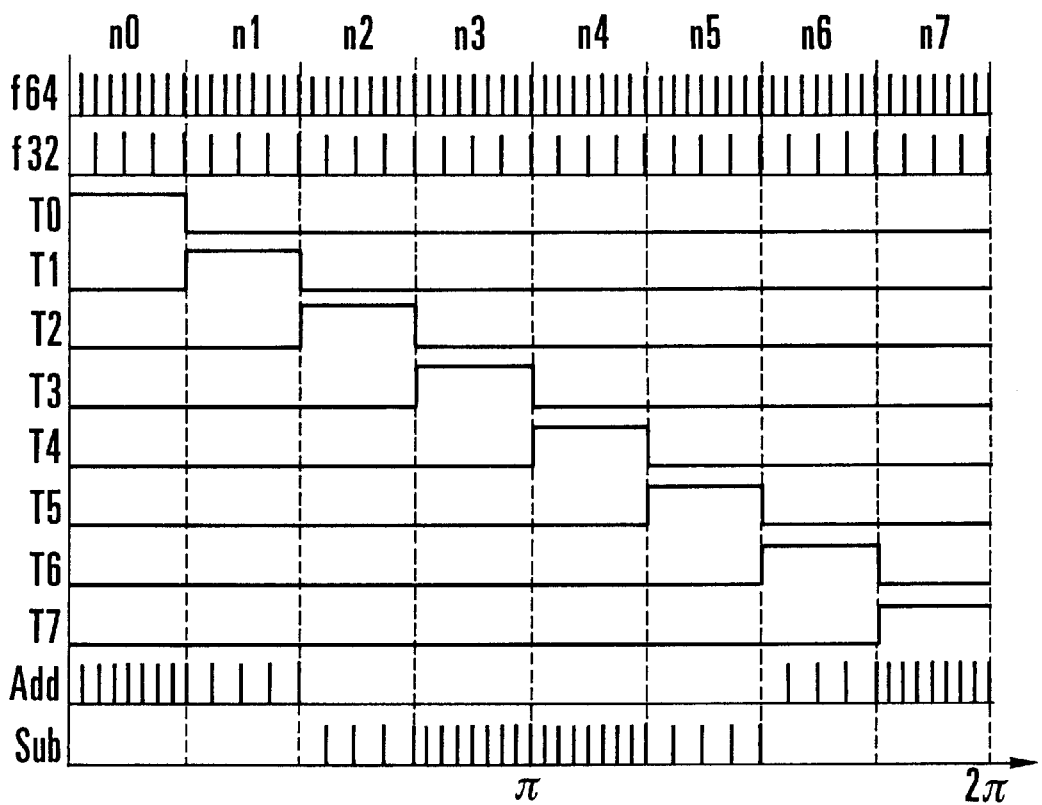

FIG. 4 shows the arrangement of the control circuit. FIGS. 5A and 5B show the operation of the control circuit. The control circuit 12A in the analog multiplication circuit 1A for multiplying the input signal f(t) by the approximate cosine wave signal will be described below.

FIG. 5A shows an example of approximation of the cosine wave signal. FIG. 5B shows the operation of the control circuit.

As shown in FIG. 5A, in the present invention, one period of the cosine wave signal is equally divided into a plurality of sections, and in this case, eight sections n0 to n7. The amplitude of the cosine wave signal (broken line in FIG. 5A) in each section is replaced with a staircase-shaped approximate cosine wave signal (bold line in FIG. 5A) with a predetermined multivalue.

For example, the amplitude in the section n1 is approximated to ½ of the positive-side maximum amplitude of 1, i.e., 0.5. The amplitude in the section n4 is approximated to the negative-side maximum amplitude of −1.

Clock signals f64 and f32 corresponding to the multivalued amplitudes are generated.

The frequency of each clock signal, i.e., the number of pulses per unit time is set in proportion to the approximate cosine wave signal amplitude. The clock signal f64 has a frequency 64 times higher than the analytic frequency $f_x$, and the clock signal f32 has a frequency 32 times higher than the analytic frequency $f_x$.

According to the clock signal f64, the input signal f(t) is received 64 times at one period. According to the clock signal f32, the input signal f(t) is received 32 times at one period.

When the clock signal f32 is used, the total amount of received charges is ½ that in use of the clock signal f64.

When the clock signal is selected in accordance with the amplitude of the approximate cosine wave signal, an output corresponding to a multiplication result of the input signal f(t) and the approximate cosine wave signal can be obtained.

Since no analog cosine wave generator is required, and only a digital circuit can be used to obtain a multiplication result, a frequency analyzing device can be constructed with a very small circuit scale.

In the present invention, as shown in FIG. 4, a reference clock signal CLK higher than the analytic frequency $f_x$ by an integer multiple, and in this case, 64 times is generated by the reference clock circuit 3. On the basis of this reference clock signal, a clock signal output circuit (counter) 21 in the timing generation circuit 2 generates the clock signals f64 and f32.

A section signal output circuit 22 generates section signals T0 to T7 shown in FIG. 5B.

The reference clock signal CLK is also used as a Charge signal for turning on the switches Q11 and Q12 shown in FIG. 3 to input charges to the capacitor C11.

The clock signal f64 used as a pulse signal, i.e., Add signal or Sub signal for outputting charges in the capacitor C11 to the output side has the same frequency as but an opposite phase to that of the Charge signal.

The control circuit 12A constructs a logic circuit by combining a plurality of logic gates. On the basis of the section signals T0 to T7, the clock signal f64 or f32 corresponding to the amplitude in each section is selected and output as the Add signal for instructing the addition operation or Sub signal for instructing the subtraction operation in accordance with the amplitude polarity.

Note that switches Q21 to Q24 (CMOSFETS) construct a CMOS inverter circuit.

For example, as shown in FIG. 5A, the amplitude in the section n1 is "0.5". For this reason, the clock signal f32 is output as the Add signal, as shown in FIG. 5B.

Since the amplitude in the section n4 is "−1", the clock signal f64 is output as the Sub signal.

Figure 6A:
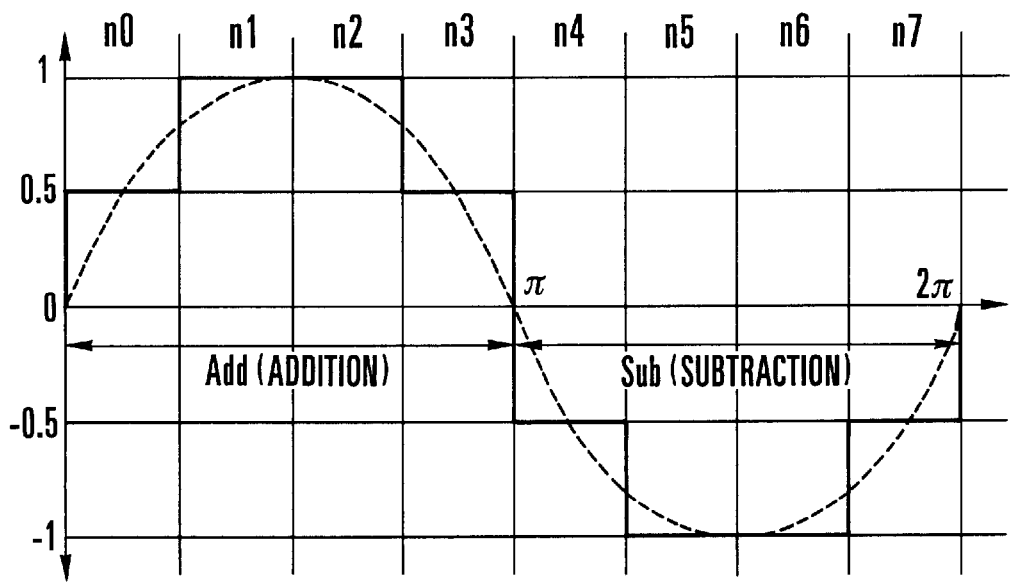
FIGS. 6A and 6B are explanatory views showing another operation of the control circuit.
Figure 6B:
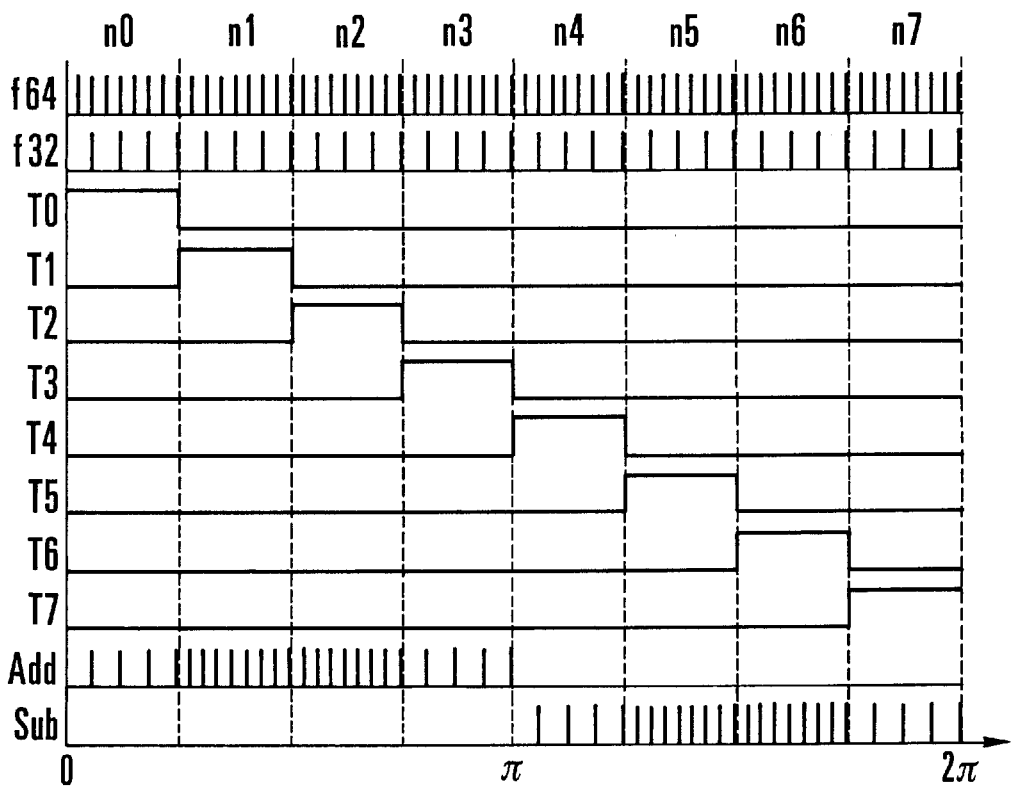

FIGS. 6A and 6B show another operation of the control circuit. In FIGS. 6A and 6B, operation of the control circuit 12B in the analog multiplication circuit 1B for multiplying the input signal f(t) by an approximate sine wave signal is shown.

In this case, almost the same operation as in FIGS. 5A and 5B is performed, though the logic circuit, i.e., combination of logic gates in the control circuit 12B is different.

As shown in FIG. 7, switched capacitor circuits may be parallelly connected to compensate for an error due to the approximate cosine wave signal or approximate sine wave signal.

FIG. 7 shows another arrangement of the analog multiplication circuit. Between the input and output terminals of the switched capacitor circuit 11, a switched capacitor circuit 11' having the same arrangement as that of the switched capacitor circuit 11 is connected in parallel. Outputs from the two circuits are synthesized and output to the analog integration circuit 4.

In this case, as a capacitor C11' of the switched capacitor circuit 11', a capacitor having a smaller capacitance than that of the capacitor C11, i.e., a capacitance ½ that of the capacitor C11 is used.

Figure 8:
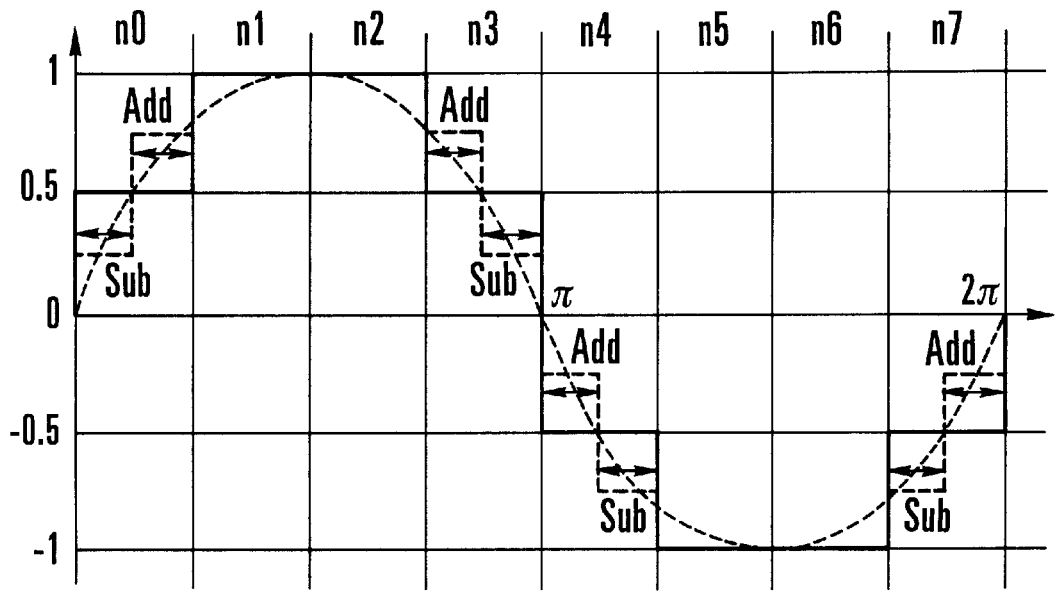
FIG. 8 is an explanatory view showing a compensated approximate cosine wave signal.
Figure 9:
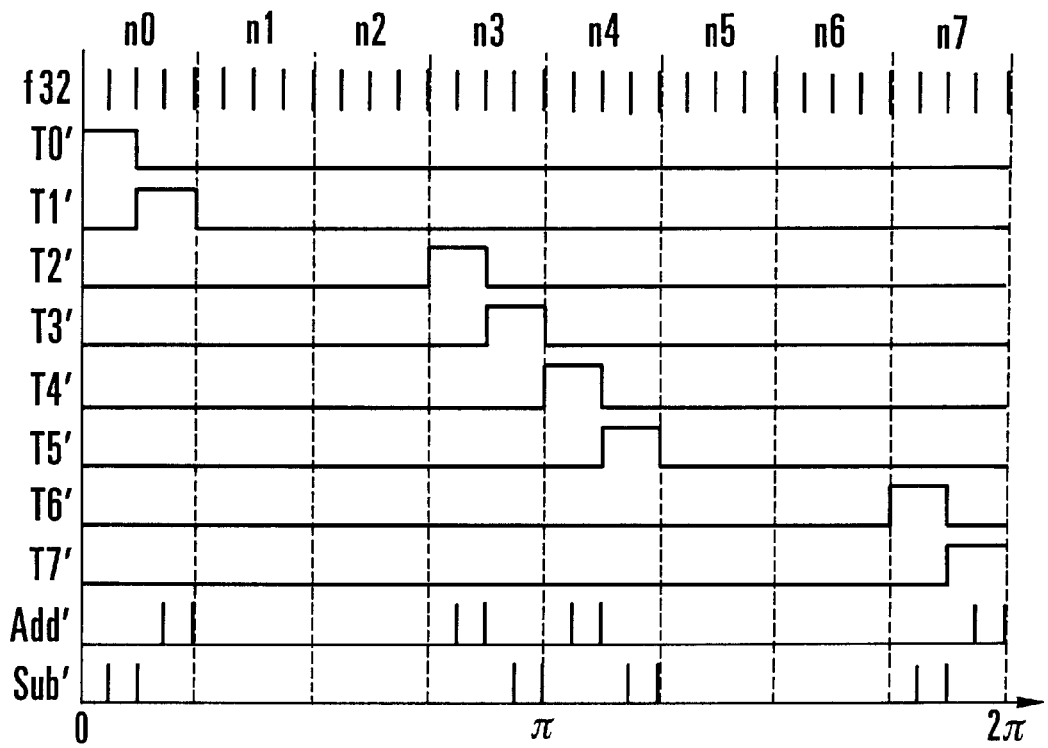
FIG. 9 is a timing chart showing the operation of an error compensation switched capacitor circuit.

FIG. 8 shows a compensated approximate cosine wave signal. FIG. 9 shows operation of the error compensation switched capacitor circuit.

As shown in FIG. 8, when a regular cosine wave signal is compared with the approximate cosine wave signal shown in FIG. 5A, errors become conspicuous in the sections n0, n3, n4, and n7.

For example, the switched capacitor circuit 11' is caused to perform subtraction in the first half of the section n0 and addition in the second half of the section n0.

With this operation, the approximate cosine wave signal (bold line in FIG. 8) is interpolated by only the charge amount received by the capacitor C11' (dotted bold line in FIG. 8).

In this case, as shown in FIG. 5B, in the section n0, an f32 Add signal is output from the control circuit 12A to the switched capacitor circuit 11.

To interpolate the signal by an amount smaller by only ½ at the first half portion of the section n0, the capacitor C11' having a capacitance ½ that of the capacitor C11 is used in the error compensation switched capacitor circuit 11' to output an identical clock signal f32 as the Sub signal to the switched capacitor circuit 11'.

A signal f16 having a ½ frequency of the clock signal f32 may be used. In this case, the capacitor C11' can have the same capacitance as that of the capacitor C11.

In FIGS. 8 and 9, the approximate cosine wave signal has been described. This arrangement can also be applied to an approximate sine wave signal.

In the above description, the amplitude of the regular cosine wave signal or sine wave signal is approximated to one of the multivalues of 1, 0.5, −0.5, and −1. However, the error due to approximation may be reduced by increasing the number of multivalues to which the signal is approximated, and generating clock signal corresponding to the levels.

With the above-described operation, a cosine wave coefficient $a_n$ of equation (1), i.e., equation (2), and a sine wave coefficient $b_n$ of equation (1), i.e., equation (3) are obtained.

Like the input signal f(t) shown in FIG. 11, the phases of vectors of an input signal are often unknown and do not match the vectors of the approximate cosine wave signal or approximate sine wave signal in the frequency analyzing device.

When phases of two vectors match, the cosine wave component FA(w) or sine wave component FB(w) is maximized. The output decreases as the phases of the two vectors shift from each other.

FIGS. 10A, 10B, and 10C show the phase relationships between the input signal and approximate cosine wave signal or approximate sine wave signal. The abscissa represents real numbers (R), and the ordinate represents imaginary numbers (I).

As shown in FIG. 10A, when the phase angle between the two signals is 0°, the cosine wave component FA(w) or sine wave component FB(w) is maximized. As the phase angle increases to 45° in FIG. 10B or 90° in FIG. 10C, the output component becomes small.

Hence, as shown in equation (4), when the cosine wave component FA(w) and sine wave component FB(w) are squared and added, and then, the square root is calculated, an output without being influenced by the phase angle between the two signals, i.e., the power spectrum F(w) of the analytic frequency $f_x$ contained in the input signal can be obtained.

As the square/addition circuit 5, a known square circuit and square root calculation circuit for an analog signal can be used.

Generally, a value obtained without square root calculation may be used as the power spectrum value. In this case, values immediately after values obtained from equations (2) and (3) are squared and added may be output.

Normally, only the power spectrum is often used. However, when equation (8) is calculated using a 2-input phase detection circuit using an analog processing circuit or a DSP for performing signal arithmetic processing for digital data after A/D conversion, the phase angle of the power spectrum of the analytic frequency contained in an input signal can be obtained.

With this arrangement, a frequency analysis result based on the magnitude and phase angle of a power spectrum can be output.

$$\theta(n) = \arctan\left(\frac{b_n}{a_n}\right) \quad (8)$$

Figure 12:
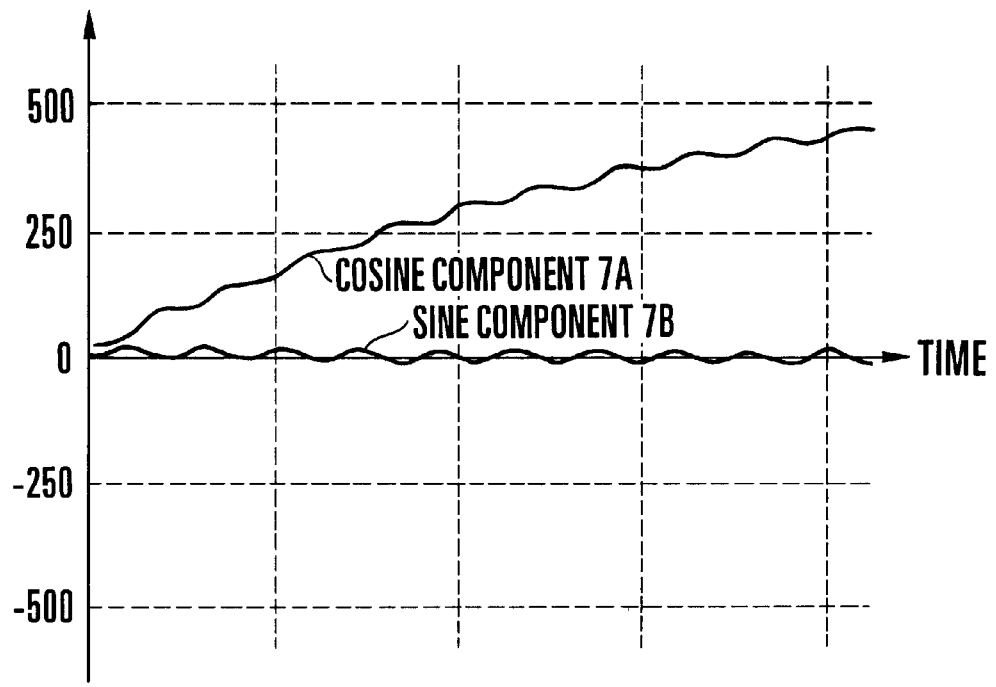
FIG. 12 is an explanatory view showing a frequency analysis result (sine wave component and cosine wave component) according to the present invention.

FIG. 12 shows a frequency analysis result (sine wave component and cosine wave component) according to the present invention.

FIG. 12 shows output waveforms obtained by simulating operations of the above-described circuits using a device model by software.

In the simulation, a signal having a single frequency fin equal to the analytic frequency $f_x$ was used as an input signal, and the signal was integrated at 10 periods. The abscissa represents time, and the ordinate represents the magnitude of the component output (integrated output).

In this case, only the cosine wave component 7A gradually increases, and the sine wave component 7B is almost zero.

This means that for the analytic frequency $f_x$, the phase angle between the input signal f(t) and approximate sine wave signal of the frequency analyzing device is almost 90° and that between the input signal f(t) and approximate cosine wave signal is almost 0°.

Figure 13:
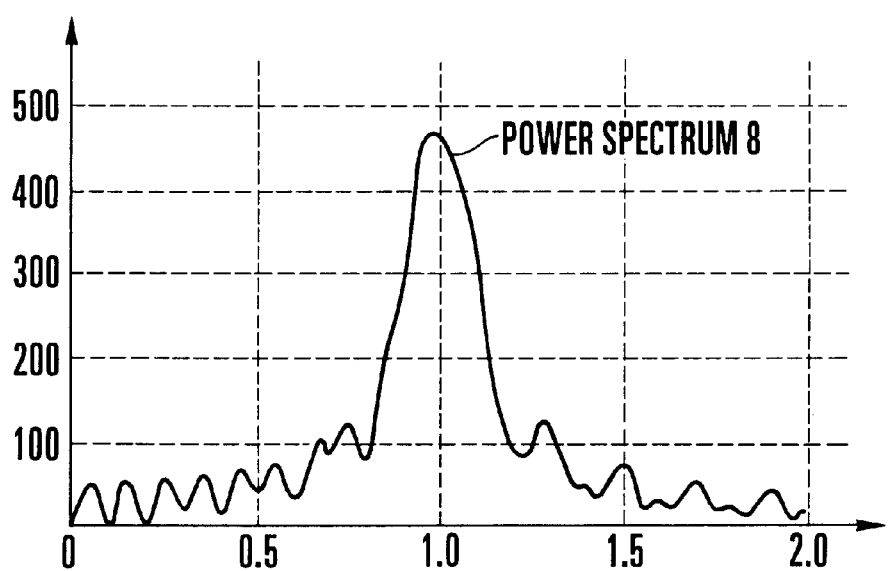
FIG. 13 is an explanatory view showing a frequency analysis result (power spectrum) according to the present invention.

FIG. 13 shows a frequency analysis result (power spectrum) according to the present invention. The analytic frequency $f_x$ was changed before and after the input signal frequency $f_{in}$.

The abscissa represents the ratio of the input signal frequency $f_{in}$ to the analytic frequency $f_x$, and the ordinate represents the magnitude of the power spectrum 8.

This result clearly reveals that a signal having a peak at $f_{in}$ is input.

In this case, when a plurality of frequencies are to be analyzed, frequency analyzing devices having unique analytic frequencies $f_x$ are parallelly arranged and operated. With this arrangement, a plurality of spectra can be simultaneously obtained from the analytic frequencies $f_x$.

When the input signal f(t) is a repetitive signal having periodicity, and the time required for frequency analysis is not strictly limited, the analytic frequency $f_x$ of one frequency analyzing device may be changed to perform measurement, like an existing spectrum analyzer.

Frequency analysis processing by Fourier transform using a sine wave signal and cosine wave signal as orthogonal function system signals has been described above. However, the present invention is not limited to this. The frequency analyzing device can also be used for frequency analysis other than Fourier transform by performing product-sum operation for an input signal using other orthogonal function system signals.

Generally, in the engineering or mathematical field, when two functions $f_1$ and $f_2$ belonging to an arbitrary function group satisfy the condition represented by equation (9), the function group is called an orthogonal function system (regular orthogonal function system, sequence of orthogonal functions, sequence of regular orthogonal functions, orthogonal system, basic function, or the like).

Note that δ is a delta function representing a pulse having a width of zero and an infinite height.

Normally, various orthogonal function systems are used by normalizing them to δ=1. In this case, the orthogonal function systems are called regular orthogonal function systems.

$\int f_1 \cdot f_2 = \delta$ for

δ=1 (when $f_1 = f_2$)

δ=0 (when $f_1 \neq f_2$) \qquad (9)

$\int \sin(x_1)\sin(x_1) = 1$ $\int \sin(x_1)\cos(x_1) = 0$ $\int \sin(x_1)\sin(x_2) = 0$ \qquad (10)

As shown in equation (10), the most general function group satisfying this condition is a trigonometric function system.

Not only the trigonometric function system but also a Walsh function system, Haar function system, Slant function system, and DCT (Discrete Cosine Transform) function system can be applied to the present invention as orthogonal function systems.

The above-described Fourier frequency analysis is used to observe the amounts of cosine and sine components represented by the trigonometric function system as an orthogonal function system in an input signal.

The method of developing an arbitrary input signal using an orthogonal function system is widely known. Many orthogonal function systems other than Fourier transform are used in accordance with their characteristic features.

As has already been described, Fourier transform uses sine and cosine waves. For this reason, when an input signal having a waveform relatively smoothly changing is analyzed, the frequency spectra of the input signal tend to concentrate.

Hence, when an input signal with a waveform relatively smoothly changing is to be analyzed, the characteristic feature of the input signal can be clearly grasped by using the sine and cosine waves as an orthogonal function system.

On the other hand, when an input signal such as a digital signal with a rectangular wave is frequency-analyzed using sine and cosine waves, the rectangular wave contains many high-frequency components of the sine and cosine waves, and the obtained spectra tend to diffuse.

Hence, when an input signal with a rectangular wave is to be analyzed, sine and cosine waves are inappropriate.

FIGS. 21A, 21B, and 21C explain the analyzed spectra by different orthogonal function systems. FIG. 21A shows an input signal with a rectangular wave. FIG. 21B shows a frequency spectrum obtained by using a trigonometric function system (sine and cosine waves). FIG. 21C shows a frequency spectrum obtained by using a Walsh function system.

Since numerous high-frequency components of sine and cosine waves are contained in the rectangular wave, the analysis result obtained in use of the trigonometric function system represents a spreading spectrum as shown in FIG. 21B, so the input signal is observed as a signal containing many high-frequency components.

Even when the rectangular wave has distortion, a change in spectrum due to the distortion cannot be clearly detected because the frequency spectrum of the rectangular wave without any distortion spreads by itself.

On the other hand, when the input signal with a rectangular wave is analyzed using a Walsh function system as an orthogonal function system of a rectangular wave, a single frequency spectrum with a small width is obtained, as shown in FIG. 21C.

When the rectangular wave has distortion, high-frequency components due to the distortion appear in the frequency spectrum to spread it, a change in spectrum due to the distortion can be clearly detected.

Hence, when an input signal with a rectangular wave is to be analyzed, not a trigonometric function system but an orthogonal function system of a rectangular wave is preferably used.

An application example of frequency analysis using an orthogonal function system other than a trigonometric function is analysis of various signal waves such as an electrocardiogram, electromyogram, and brain wave observed from a living body.

FIGS. 22A and 22B show typical electrocardiograph signal waveforms. As shown in FIG. 22A, for a normal person, a spike-shaped wave is continuously observed.

If a wave has an abnormality, the repetitive interval of a waveform R shown in FIG. 22B may change, a waveform P, Q, S, or T may be distorted, or an abnormal spike-shaped signal may irregularly be inserted.

Figure 17:
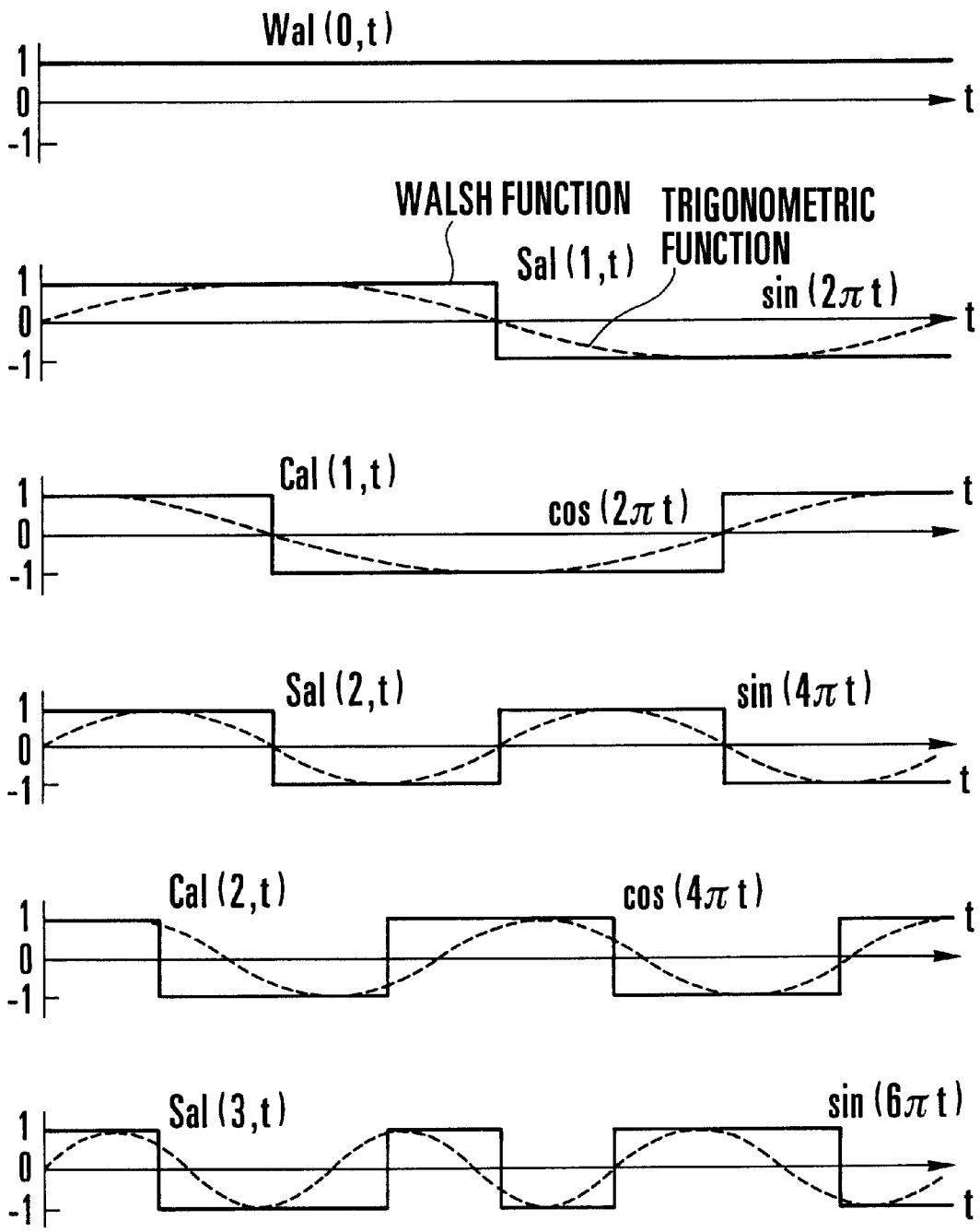
FIG. 17 is an explanatory view showing a Walsh function system.

In analysis of such a signal as well, when the frequency is analyzed using not a trigonometric function but an orthogonal function system of a rectangular wave, e.g., Walsh function system shown in FIG. 17 or Haar function system shown in FIG. 18, high-frequency components due to abnormal portions can be clearly confirmed from the spectrum, and the abnormality is easy to find.

The frequency analyzing device of the present invention can operate at a high speed. In addition, a plurality of frequency analyzing devices can be integrated on one chip. For this reason, the frequency analyzing device is optimum for a very compact and low-power-consumption apparatus such as an electrocardiograph monitoring apparatus or electromyograph monitoring apparatus which is always attached to a human body to monitor an abnormality.

As application fields of frequency analysis using an orthogonal function system, in addition to analysis of various vital signals, analysis of a seismic wave, artificial seismic wave, or a digital signal in the communication field can be exemplified.

Another application field of the frequency analyzing device according to the present invention is an application to voiceprint analysis or speech recognition.

Various processing methods are used for speech recognition. An effective method is speech recognition using orthogonal transform.

In this method, a voice signal is divided into appropriate short sections and orthogonally transformed. The time axis is set along the abscissa, and a change in magnitude of each frequency component as a function of time is measured. The obtained pattern is compared with a reference voice pattern, thereby recognizing the voice.

FIG. 23 shows an example of frequency analysis used for speech recognition.

In this case, the abscissa represents the elapse time in short sections obtained by dividing a voice signal, and the ordinate represents frequency components and intensities in each section.

As the time elapses, the frequency component and intensity of the voice signal in each section change, and each change has a unique pattern.

In this application, as shown in FIG. 2, when a plurality of frequency analyzing devices are parallelly connected, and high-speed orthogonal transform processing is performed for each waveform divided in units of predetermined times, the pattern as shown in FIG. 23 can be obtained.

Figure 19:
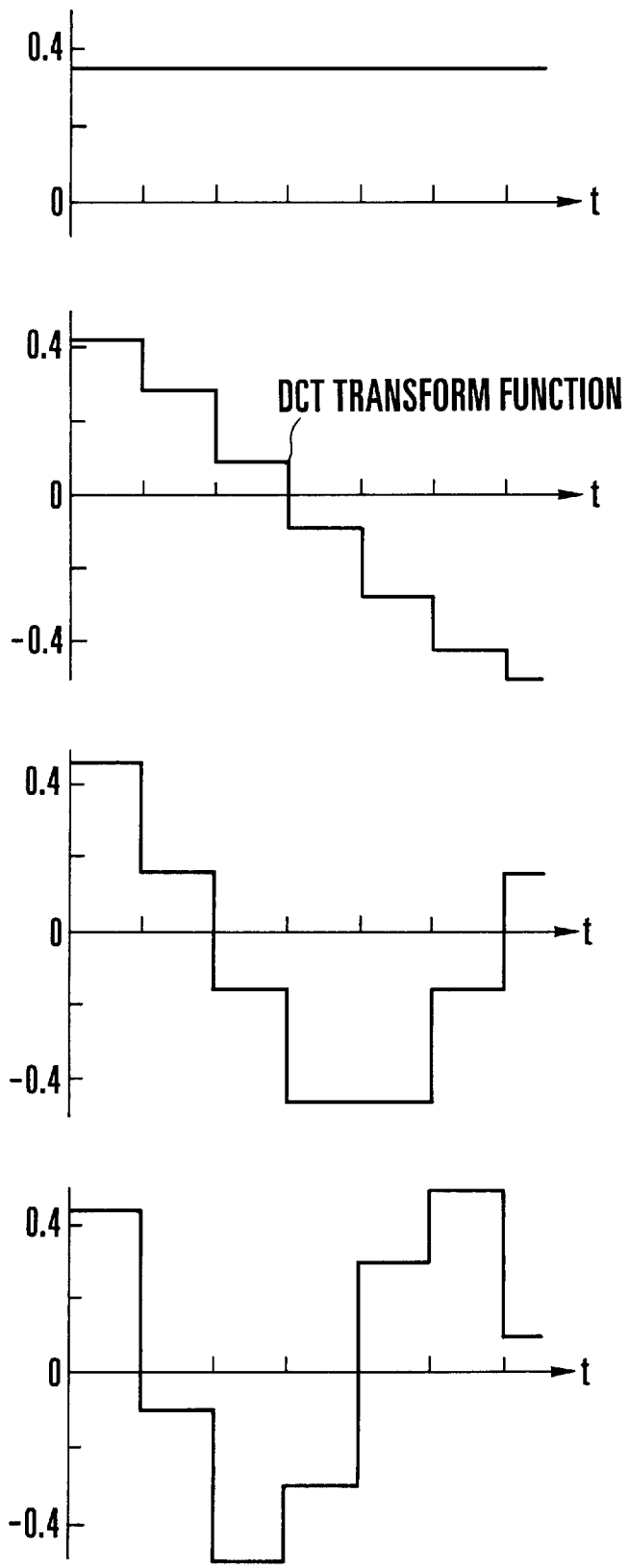
FIG. 19 is an explanatory view showing a Slant function system.
Figure 20:
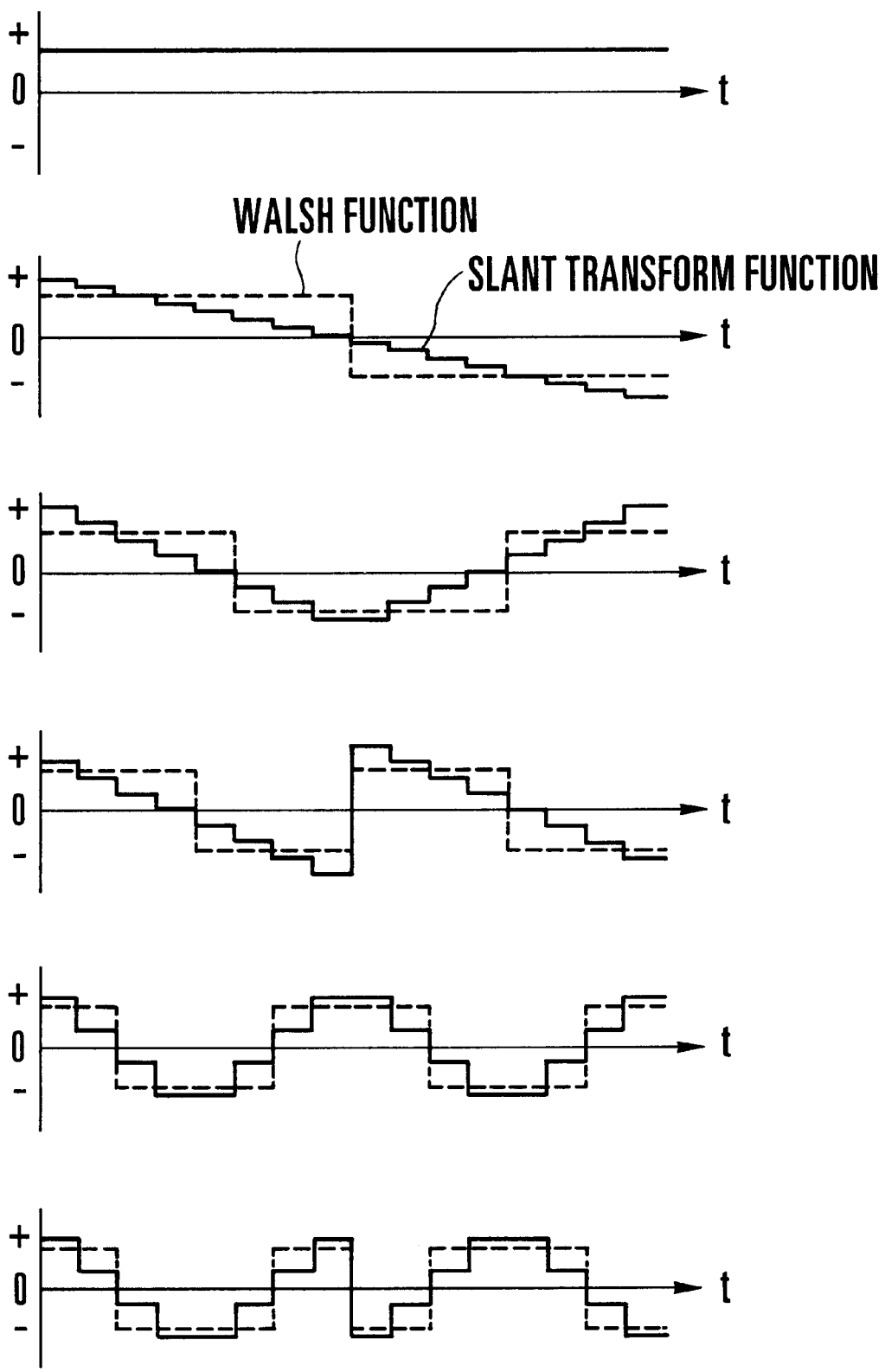
FIG. 20 is an explanatory view showing a DCT function system.

Especially, in applications of this type, orthogonal transform capable of separating the characteristic feature of each voice as clearly as possible is more advantageous. Not Fourier transform using a trigonometric function but an orthogonal function system such as a DCT function system shown in FIG. 19 or a Slant function system shown in FIG. 20 is often used as well as a Walsh function system or Haar function system.

Another application field of the frequency analyzing device of the present invention is filter processing, image compression, or image feature extraction.

FIGS. 24A to 24F show an image compression processing method.

As shown in FIG. 24A, assume that original image data has a 4×4 matrix. A large image is segmented into small blocks.

The original image data is formed from sampled analog signals (to be referred to as discrete analog signals herein) representing luminance values.

As is widely known for digital image compression, DCT or Slant transform exhibits a satisfactory result. DCT is also used for JPEG compression processing.

For this reason, as an orthogonal function system, when not a trigonometric function but a DCT function system or Slant function system is used, a satisfactory result can be obtained. A trigonometric function system may be used, as a matter of course.

Using a frequency analyzing device according to the present invention, which has an arrangement shown in FIG. 24B, original image data is scanned in units of rows in the horizontal (row) direction to obtain four frequency components ($f_1$ to $f_4$).

This processing is repeated for only four horizontal rows, the same 16 frequency components as in the original image can be obtained as an output result, as shown in FIG. 24C.

Next, this result is arranged in the same 4×4 matrix as the original image, as shown in FIG. 24D. After this, as shown in FIG. 24E, the same frequency analyzing device as in the previous processing is used to scan the original image data in units of rows in the vertical (column) direction, thereby obtaining four frequency components ($f_1$ to $f_4$).

When this processing is repeated for only four vertical columns, the same 16 frequency components as in the original image can be obtained as an output result, as shown in FIG. 24F.

As a result, image data whose all vertical and horizontal pixels are orthogonally transformed can be obtained.

Original images may be input one after another by doubling the circuit. When the frequency analyzing device of the present invention is used, the circuit arrangement can be made very compact.

A 2×2 portion (broken line in FIG. 24F) containing DC components is extracted from the obtained frequency spectrum and stored.

With this processing, the original image data is compressed to a ¼ size.

Reconstruction can be done by a reconstruction circuit shown in FIG. 25.

Referring to FIG. 25, as each switched capacitor circuit, the same circuit as that used for compression processing, i.e., the circuit shown in FIG. 1 is used.

Outputs from the switched capacitor circuits are converted into voltages by current/voltage conversion circuits and then added by an adder to obtain an inversion result, so the image data is restored.

Hence, a high-speed and low-power-consumption image compression/reconstruction circuit capable of processing image data by analog processing can be constructed.

When the frequency of an input signal is to be analyzed using another orthogonal function system, part of the above-described present invention, which generates a pulse signal for controlling the switched capacitor circuit from an approximate cosine wave, i.e., the logic circuit in the control circuit 12A shown in FIG. 4 is changed, and a pulse signal based on another orthogonal function system such as the Walsh function system or Haar function system is generated.

With this arrangement, frequency analysis using an orthogonal function system other than a trigonometric function can be performed. The amounts of frequency components of the orthogonal function system, which are contained in the input signal, can be detected. The frequency components correspond to the cosine and sine wave components in the trigonometric function.

A power spectrum can also be obtained by squaring the amplitude value of each frequency component, as in the above-described trigonometric function.

For example, in the Walsh function system, sal(l,t) and cal(l,t) are frequency components corresponding to sin(2πt) and cos(2πt) in the trigonometric function, and the square sum of the two signal components is calculated.

As has been described above, in the present invention, a multiplication circuit which controls a switched capacitor circuit for discretely storing an input signal using a predetermined pulse signal whose frequency changes according to the amplitude of an orthogonal function system signal having an analytic frequency, and outputs charges representing the multiplication result of the input signal and the orthogonal function system signal is arranged. Charges output from the multiplication circuit are integrated, and the integration values are output as signal components of the analytic frequency contained in the input signal.

The same multiplication result as in analog processing can be obtained using only a digital circuit. Circuit portions with a relatively large scale, such as the sine wave generator in the conventional frequency analyzing device based on analog processing or the A/D converter and DSP in the frequency analyzing device based on digital processing, are unnecessary. A frequency analyzing device which has a very small circuit scale and can be integrated on a small semiconductor chip can be realized without reducing the speed of frequency analysis.

Since a plurality of frequency analyzing devices can be arranged on one semiconductor integrated circuit, a high-speed frequency analyzing device capable of simultaneously measuring spectra of a plurality of frequencies from an input signal can be realized.

What is claimed is:

1. A frequency analyzing device operative to detect a signal component of a predetermined analytic frequency contained in an input signal, the frequency analyzing device comprising:

a multiplication circuit which controls a switched capacitor circuit operative to discretely receive charges from the input signal using a predetermined pulse signal whose frequency changes according to an amplitude of an orthogonal function system signal having the analytic frequency, wherein said switched capacitor circuit outputs charges representing a multiplication result of the input signal and the orthogonal function system signal; and an integration circuit operative to integrate the charges output from said multiplication circuit and to provide integration values corresponding to the signal components of the analytic frequency contained in the input signal.

2. A device according to claim 1, wherein said multiplication circuit comprises a switched capacitor circuit for discretely storing the input signal, thereby outputting charges corresponding to the number of times of charging, and a control circuit for controlling the number of times of charging per unit time in said switched capacitor circuit in accordance with an amplitude represented by a multivalue of the orthogonal function system signal having the analytic frequency, and outputting the pulse signal for controlling a charging polarity in said switched capacitor circuit in accordance with an amplitude polarity of the orthogonal function system signal.

3. A device according to claim 2, wherein said control circuit comprises a logic circuit for, on the basis of a section signal representing a section formed by dividing a period of the orthogonal function system signal into a plurality of sections, selecting a clock signal having a frequency corresponding to the amplitude represented by the multivalue of the orthogonal function system signal in each section, thereby generating the pulse signal to be output to said switched capacitor circuit.

4. A device according to claim 1, wherein said integration circuit comprises an amplifier formed from an odd number of CMOS inverters connected in series, and a resistive element and a capacitive element, which are parallelly connected between input and output terminals of said amplifier.

5. A device according to claim 4, wherein said integration circuit comprises a high-gain amplifier formed from an odd number of CMOS inverters connected in series, and a resistive element and a capacitive element with a relatively small capacitance, which are parallelly connected between input and output terminals of said amplifier.

6. A device according to claim 1, further comprising a first set formed from a multiplication circuit and an integration circuit to multiply and integrate a first signal wave having a predetermined phase in the orthogonal function system signal with the input signal, thereby outputting a first signal wave component contained in the input signal, and a second set formed from a multiplication circuit and an integration circuit to multiply and integrate a second signal wave having a phase perpendicular to the first signal wave with the input signal, thereby outputting a second signal wave component contained in the input signal.

7. A device according to claim 6, further comprising an arithmetic circuit for calculating a square sum of the first and second signal components to output a power spectrum of the analytic frequency contained in the input signal.

8. A device according to claim 6, further comprising an arithmetic circuit for calculating a square ratio of the first and second signal components to output a phase angle of a power spectrum of the analytic frequency contained in the input signal.

9. A device according to claim 1, wherein as the orthogonal function system signal, an approximate cosine wave signal or an approximate sine wave signal obtained by approximating an amplitude of a cosine wave signal or a sine wave signal of a trigonometric function system using a multivalue is used.

* * * * *